United States Patent
Manepalli et al.

(10) Patent No.: US 9,312,233 B2
(45) Date of Patent: Apr. 12, 2016

(54) METHOD OF FORMING MOLDED PANEL EMBEDDED DIE STRUCTURE

(71) Applicant: Intel Corporation, Santa Clara, CA (US)

(72) Inventors: Rahul N. Manepalli, Chandler, AZ (US); Hamid R. Azimi, Chandler, AZ (US); John S. Guzek, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 302 days.

(21) Appl. No.: 13/928,796

(22) Filed: Jun. 27, 2013

(65) Prior Publication Data

US 2015/0003000 A1  Jan. 1, 2015

(51) Int. Cl.
*H05K 13/04* (2006.01)
*H01L 23/00* (2006.01)
*H01L 23/31* (2006.01)
*H01L 21/56* (2006.01)
*H05K 3/00* (2006.01)
*H05K 3/46* (2006.01)

(52) U.S. Cl.
CPC ............. *H01L 24/19* (2013.01); *H01L 24/96* (2013.01); *H05K 3/4682* (2013.01); *H01L 21/561* (2013.01); *H01L 21/568* (2013.01); *H01L 23/3114* (2013.01); *H01L 24/03* (2013.01); *H01L 24/11* (2013.01); *H01L 2224/02379* (2013.01); *H01L 2224/0401* (2013.01); *H01L 2224/04105* (2013.01); *H01L 2224/05548* (2013.01); *H01L 2224/12105* (2013.01); *H01L 2224/131* (2013.01); *H01L 2224/16237* (2013.01); *H01L 2224/96* (2013.01); *H01L 2924/0665* (2013.01); *H01L 2924/12042* (2013.01); *H01L 2924/1432* (2013.01); *H01L 2924/1436* (2013.01); *H01L 2924/181* (2013.01); *H01L 2924/186* (2013.01); *H05K 3/0097* (2013.01); *H05K 3/4679* (2013.01); *H05K 2201/09918* (2013.01); *H05K 2203/1536* (2013.01)

(58) Field of Classification Search
CPC ......... H01L 24/03; H01L 24/11; H01L 24/19; H01L 24/96; H01L 2924/00; H01L 2924/014; H01L 2224/02379; H01L 2224/03; H01L 2224/0401; H01L 2924/0665; H01L 2224/04015; H01L 2224/05548; H01L 2224/11; H01L 2924/12042; H01L 2224/12106; H01L 2224/131; H01L 2924/1436; H01L 2224/16237; H01L 2224/186
See application file for complete search history.

(56) References Cited

U.S. PATENT DOCUMENTS

| | | | | |
|---|---|---|---|---|
| 5,279,029 A | * | 1/1994 | Burns | ............ H01L 21/565 257/E21.504 |
| 6,262,513 B1 | * | 7/2001 | Furukawa | ............ H01L 21/56 257/E21.502 |
| 7,956,453 B1 | * | 6/2011 | Kim | ............ H01L 23/3128 257/692 |

\* cited by examiner

*Primary Examiner* — Carl Arbes
(74) *Attorney, Agent, or Firm* — Winkle, PLLC (57) ABSTRACT

Methods of forming molded panel coreless package structures are described. Those methods and structures may include fabrication of embedded die packages using large panel format and use of molding to improve rigidity of the panel, as well as to embed the die in a non-sacrificial mold material. The methods and structures described include methods for manufacturing thin, coreless substrate architectures which possess low warpage.

28 Claims, 13 Drawing Sheets

METHOD OF FORMING MOLDED PANEL EMBEDDED DIE STRUCTURE

BACKGROUND OF THE INVENTION

As semiconductor technology advances for higher processor performance, advances in packaging architectures may include coreless package structures, such as bumpless build-up Layer (BBUL-C) package architectures and other such assemblies. Current process flows for coreless packages involve building the substrate up on a temporary core/carrier capped with copper foil, which is then etched off after the package is separated from the core. For example, typical embedded die package structures and coreless high density interconnect (HDI) substrates depend on the use of sacrificial panel cores.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as package structures comprising molded panels with embedded die, are described. Those methods/structures may include forming a first thin foil on a first side of a base foil and a second thin foil on a second side of the base foil, forming a first molding material directly on the first thin foil and forming a first molding material directly on the second thin foil, wherein the first mold material is non-sacrificial, and then coupling at least one die to the first molding material. The molded panel package structures enables dual sided processing of molded panel substrate core architectures, wherein the molded panel is retained in the final package structure.

Figure 1A:
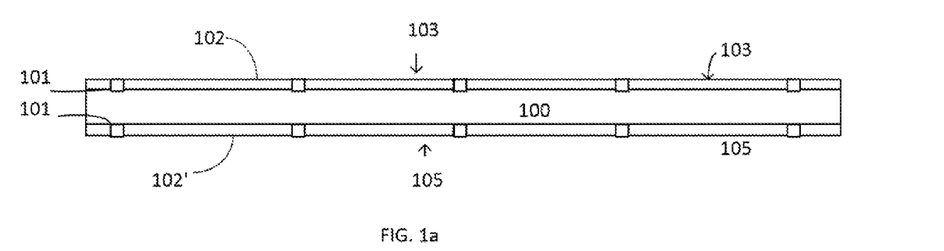
FIGS. 1a-1h represents a cross-sectional views of structures according to embodiments.
Figure 1B:
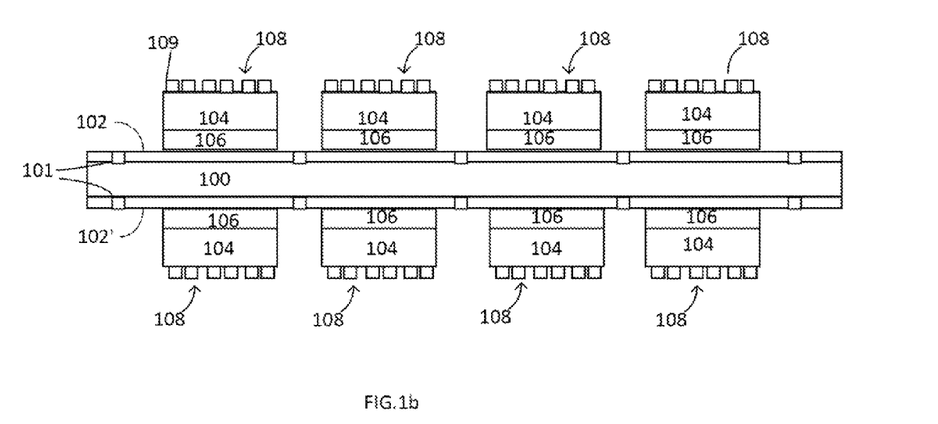

FIGS. 1a-1h depict cross-sectional views of embodiments of forming molded panel substrate structures. In FIG. 1a, a first thin foil 102 may be formed on/attached to a first side 103 of a base foil and a second thin foil 102' may be formed on/attached to a second side 105 of the base foil 100. In an embodiment, the base foil 100 and the first and second thin foil 102,102' may comprise a copper material, but may comprise other suitable conductive materials in an embodiment. In an embodiment, the base foil 100 may comprise a thickness of about 20 to about 100 microns, and at least one of the first and second thin foils 102, 102' may comprise a thickness of about 5 to about 10 microns. In an embodiment, the base foil 100 thickness may be optimized depending upon the particular stiffness required for a particular packaging application. In an embodiment, the first and second thin foils 102, 102' may be attached to the base foil 100 with an adhesive material. In an embodiment, fiducial structures 101 may be formed on/in the first and second thin foils 102, 102'. The fiducials 101 may be formed by a drilling and/or marking processes. The fiducials 101 may be spaced apart from one another to facilitate subsequent placement of die on the first and second thin foils 102, 102'.

At least one die 108 may be attached to the first thin foil 102 and may be attached to the second thin foil 102' (FIG. 1 b). The at least one die 108 may comprise a die backside film 106, a die body 104 and interconnect structures 109. The fiducial structures 101 may serve as alignment fiducials to allow for precise placement of the at least one die 108 on the first and second layers of thin foil 102, 102'.

Figure 1C:
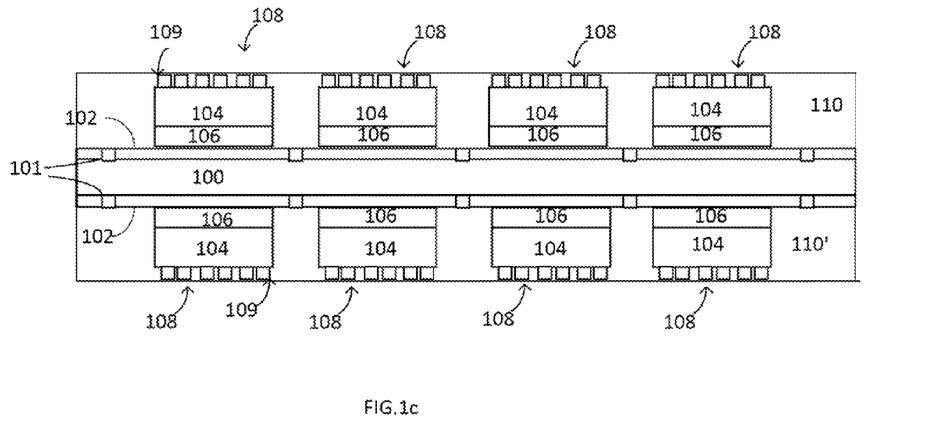

In an embodiment, a non-sacrificial molding material 110, 110' may be applied to both the first thin foil 102 and the second thin foil 102' respectively (FIG. 1c). In an embodiment, the molding material may comprise a first molding material 110 and a second molding material 110'. The molding material 110, 110' may comprise any suitable molding material according to the particular application, and may surround the at least one die 108. In some embodiments, the molding material 110, 110' may comprise materials such as epoxy materials, epoxy-silica composites and/or other thermosetting systems such as silicone-silica composites, and/or epoxy-silicone silica composites. In an embodiment, the molding material 110, 110' may comprise a thickness of between about 100 to about 400 microns, but may vary according to the particular application. In an embodiment, the molding material 110, 110' may be applied using such techniques as compression molding, injection molding and/or transfer molding techniques. In an embodiment, the at least one die 108 may be embedded in the molding material 110, 110'.

In an embodiment, the interconnect structures 109 of the at least one die 108 may be protected during the molding process by the use of a flexible film that may be placed between the interconnect structures 109 and a top surface of the mold material 110, 110'. A mold compound flash step may be employed after the mold material 110, 110' is cured, so that remnants of the mold material 110, 110' disposed on top of the interconnect structures 109 may be removed. In addition, additional mold residue that mat be present on top of the interconnect structures 109 may be removed prior to a subsequent conductive seed layer deposition, by using either a pre deposition plasma clean, or a desmear process. The mold compound 110, 110' may be chosen to optimize desired thermo mechanical properties such that package structures utilizing the molded panel structures disclosed herein may provide stiffening for the entire stack once the mold compound is cured, and to provide package warpage benefits after singulation of die from the molded panel structures, as well as providing mechanical support during subsequent processing such as surface mount attach processing.

Figure 1D:
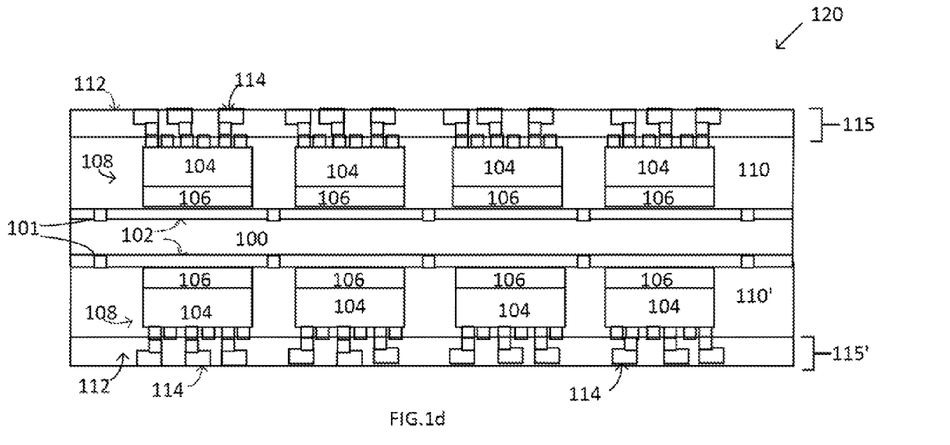

At least one build up layer 115, 115' may be formed on the mold material 110, 110' (FIG. 1d). The at least on build up layer 115, 115' may comprise a dielectric layer 112 and conductive layer 114. In an embodiment, a plurality of build up layers 115, 115' may be stacked upon each other according to the particular application. In an embodiment, a multi-layer dual sided molded panel 120 may be formed comprising non-sacrificial molding 110, 110'.

Figure 1E:
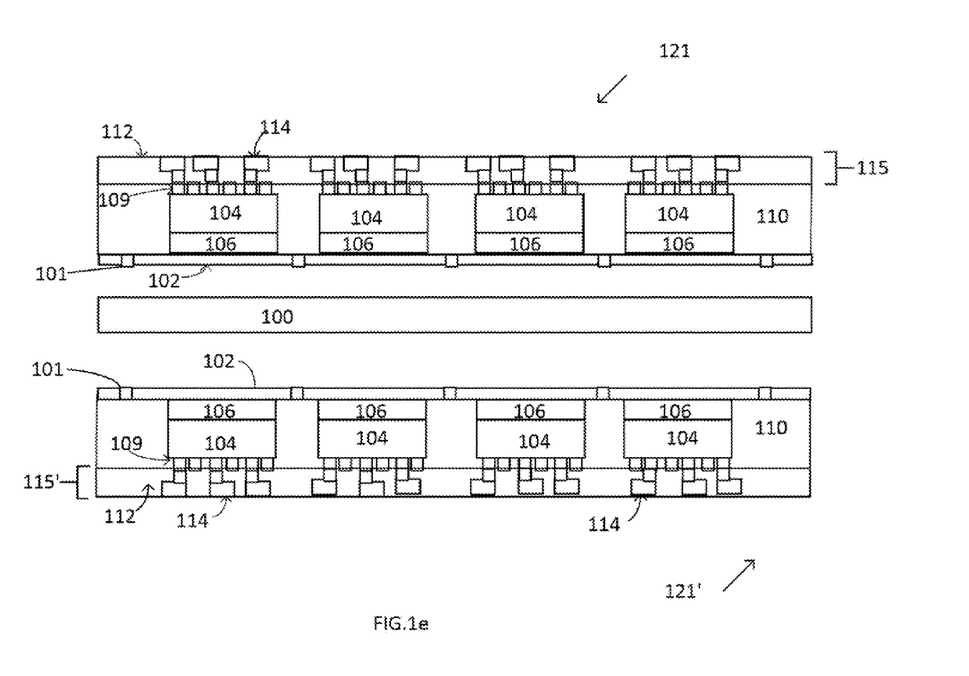
Figure 1F:
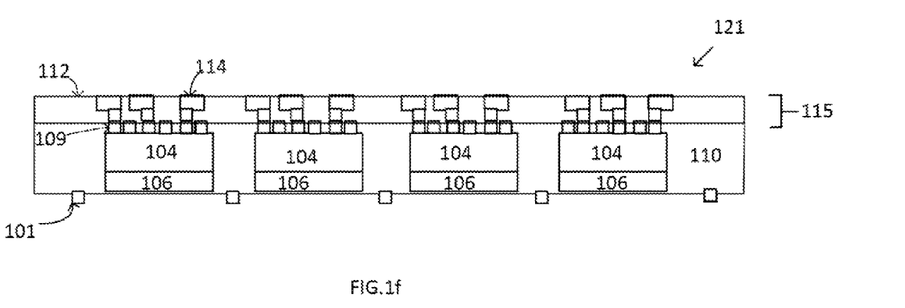
Figure 1G:
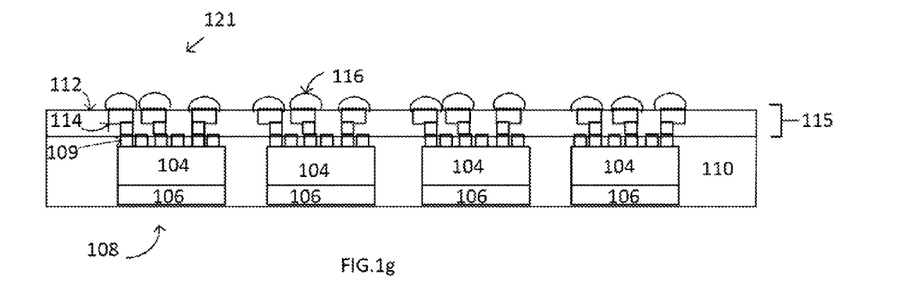
Figure 1H:
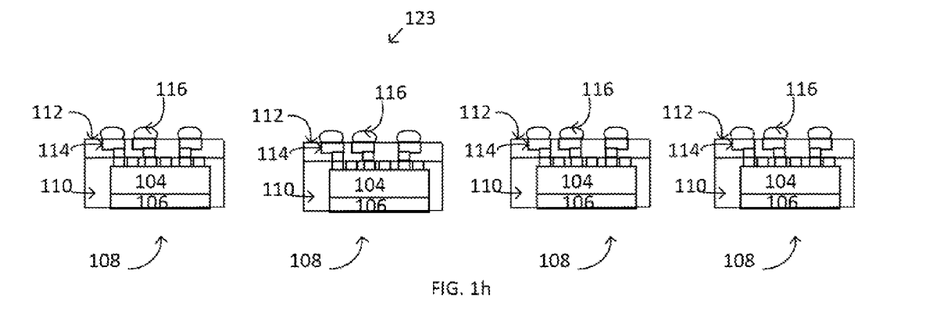

In an embodiment, each side of the molded panel 120 may be de-paneled at the thin foil 102, 102'-base foil 100 interface, thus creating two individual molded panels 121, 121 comprising embedded die 108 (FIG. 1e). The thin foil 102, 102' may be removed in an embodiment from the molded panels 121, 121' (depicting molded panel 121 only) (FIG. 1f). The foil 102, 102' may be removed using an etching process in some embodiments. Bumps 116, which may comprise solder interconnect bumps 116, may be formed on/coupled with the build up layers 115, 115' (FIG. 1g). Individual die of the least one die 108 may be singulated from the molded panels 121, 121' to create embedded, molded die packages 123 (FIG. 1h). In an embodiment, the base foil 100 maybe recycled to create another molded panel.

Figure 2A:
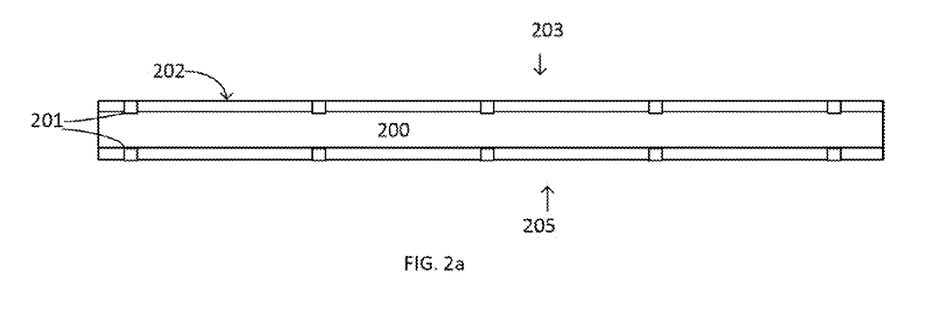
FIGS. 2a-2g represent cross-sectional views of structures according to embodiments.

In another embodiment, a molded panel core architecture may be formed comprising molding material formed directly on the foil (FIGS. 2a-2g). In FIG. 2a, a thin foil 202 may be formed/attached on a first side 203 of a base foil 200 and a thin foil 202' may be formed/attached on a second side 205 of the base foil 200. A lamination process may be used to attach the thin foil 202, 202' to the base foil 200. In an embodiment, the base foil 200 and the thin foil 202,202' may comprise a copper material, and their respective thicknesses may be optimized depending upon the requirements of a particular application. In an embodiment, fiducial structures 201 may be formed on/in the thin foil 202, 202'. The fiducials 201 may be formed by a drilling and/or marking processes (such as by utilizing a laser and or a mechanical process). The fiducials 201 may be used to align the placement of die to be subsequently attached to the core structure.

Figure 2B:
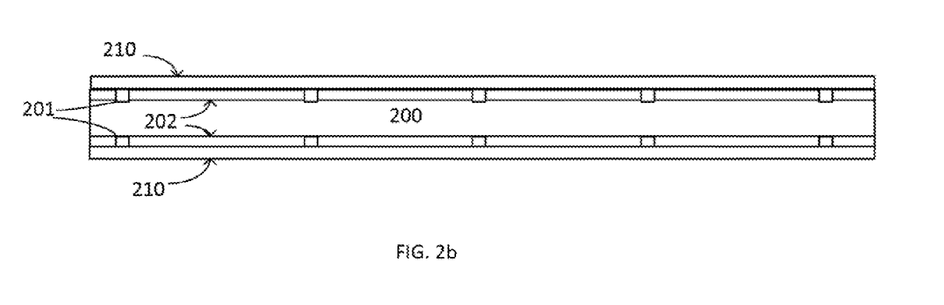

In an embodiment, a molding material 210, 210' may be applied directly to both the thin foil 202 disposed an the first side 203 of the base foil 200 and the thin foil 202' disposed on the second side 205 of the base foil 200 (FIG. 2b). The molding material 210, 210' may comprise any suitable molding material according to the particular application. In an embodiment, the molding material 210, 210' may comprise a thickness of between about 100 to about 400 microns.

Figure 2C:
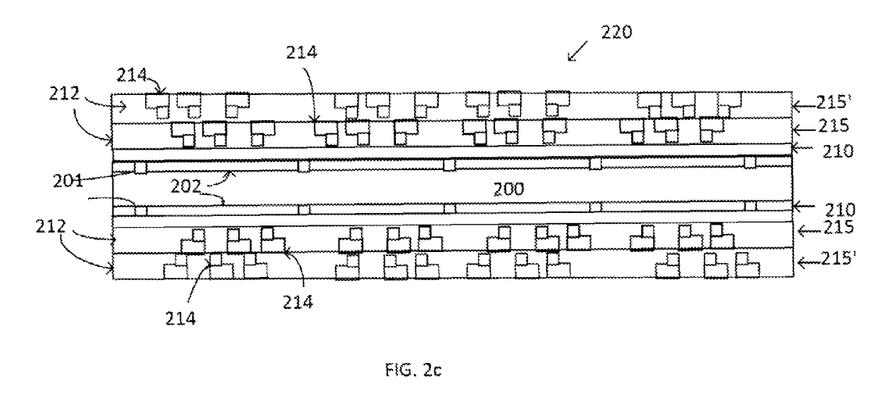
Figure 2D:
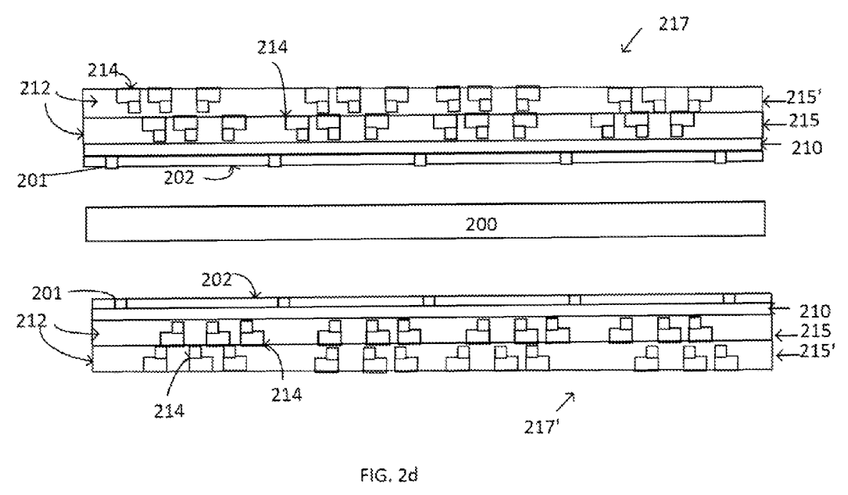

At least one build up layer 215, 215' may be formed on the mold material 210, 210' (FIG. 2c). The at least one build up layer 215, 215' may comprise dielectric layer 212 and conductive layer 214. In an embodiment, a plurality of build up layers 215, 215' may be stacked upon each other on the first side 203 of the base foil 200 and on the second side 205 of the base foil 200, according to the particular application. In an embodiment, the initial build up layers 215 may be formed directly on the molding material 210, 210' on both sides of the base foil 200.

Figure 2E:
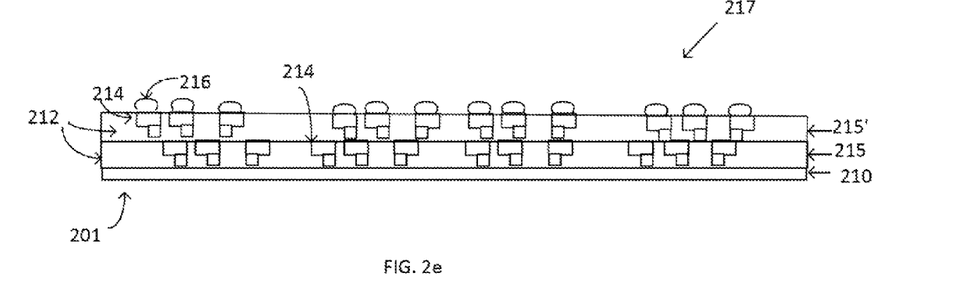

In an embodiment, a thin, careless multi layered, dual sided panel 220 may be formed, wherein the panel dual sided panel 220 comprises minimal warpage due to the non-sacrificial 210, 210' molding material incorporated into the panel 220. In an embodiment, the dual sided panels 220 may be separated/de-paneled at the base material 200 (FIG. 2d) to form two individual molded panels 217, 217', and the thin foil 202, 202' may be removed from the thin molding material 110, 110' (depicting individual panel 217) (FIG. 2e).

Figure 2F:
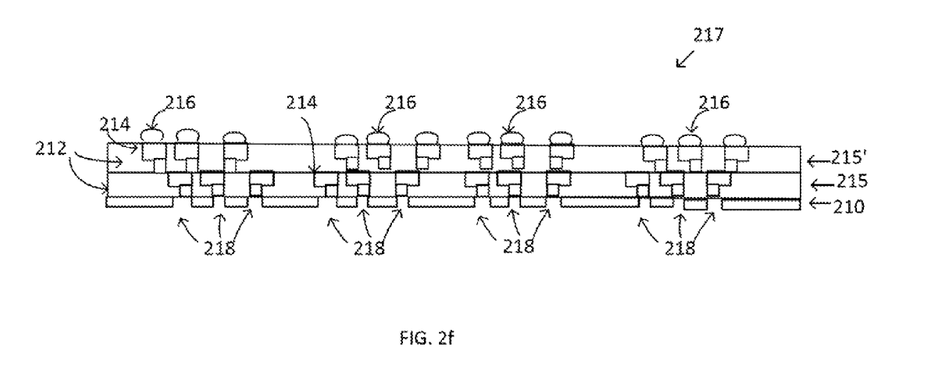
Figure 2G:
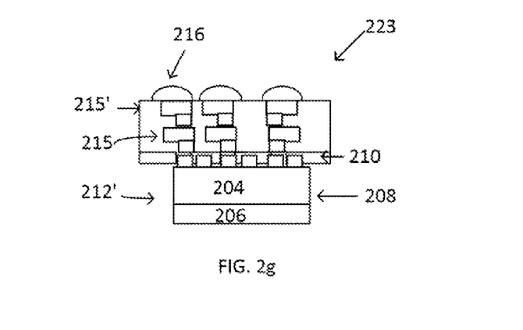

Bumps 216, which may comprise solder interconnect bumps, 216, may be formed on/coupled with the build up layers 215, 215'. In an embodiment, the molding material 210, 210' may be patterned and etched to form openings 218 (FIG. 2f). At least one die 208 may be coupled with the openings 218 in the molding material 210, 210' of the panels 217, 217'. In an embodiment, the at least one die 208 may be singulated from the molded panels 217, 217' to create a careless, molded die package 223 (FIG. 2g).

Figure 3A:
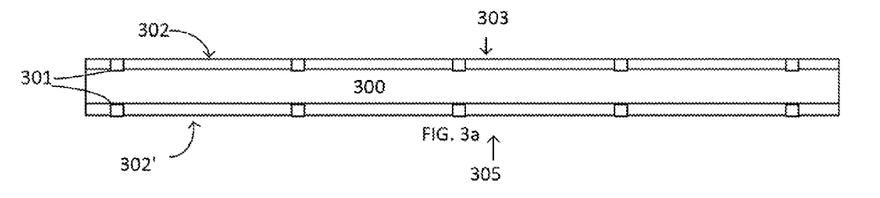
FIGS. 3a-3h represents cross-sectional views of structures according to embodiments.

In another embodiment, a molded panel core architecture may be formed comprising molding material formed directly on the fail (FIGS. 3a-3h). In FIG. 3a, a thin foil 302 may be formed/attached on a first side 303 of a base foil 300 and a thin foil 302' may be formed/attached on a second side 305 of the base foil 300. A lamination process may be used to attach the thin foil 302, 302' to the base foil 300. In an embodiment, the base foil 300 and the thin foil 302,302' may comprise a copper material, and their respective thicknesses may be optimized depending upon the requirements of a particular application. In an embodiment, fiducial structures 301 may be formed on/in the thin foil 302, 302'. The fiducials 301 may be formed by a drilling and/or marking processes.

Figure 3B:
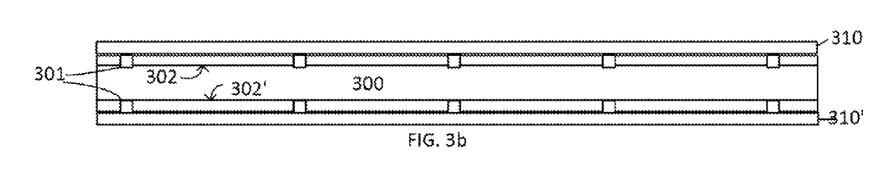

In an embodiment, a thin molding material 310, 310' may be applied directly to both the thin foil 302 disposed on the first side 303 of the base foil 300 and the thin foil 302' disposed on the second side 305 of the base foil 300 (FIG. 3b). The thin molding material 310, 310' may comprise any suitable molding material according to the particular application, and may comprise a first molding material 310, 310' in an embodiment. In an embodiment, the thin molding material 310, 310' may comprise a thickness of between about 100 to about 400 microns.

Figure 3C:
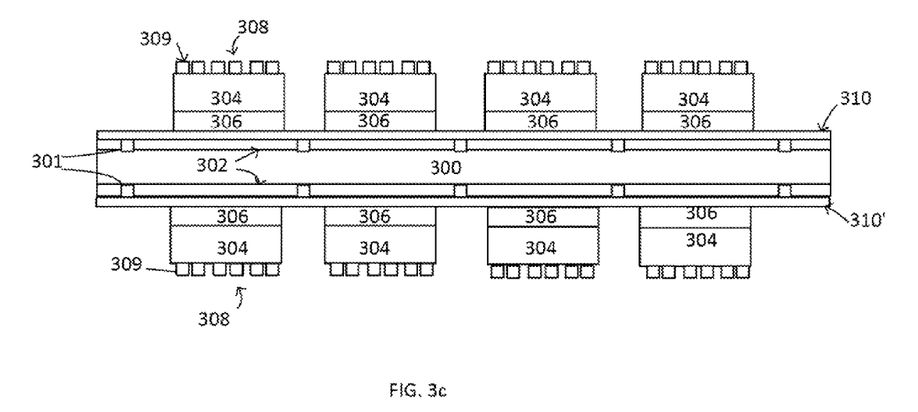

At least one die 308 may be attached to the thin molding material 310, 310' (FIG. 3c). The at least one die 308 may comprise a die backside film 306, a die body 304 and interconnect structures 309. The fiducial structures 301 may serve as alignment fiducials to allow for precise placement of the at least one die 308 on the layers of thin molding material 310, 310', wherein the at least one die 308 may be positioned between fiducial structures 301.

Figure 3D:
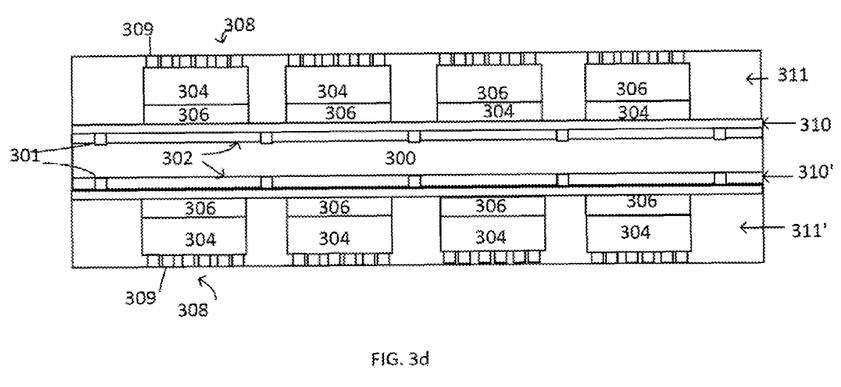

In an embodiment, a molding material 311, 311 may be applied to the thin molding material 310, 310' and may surround the at least one die 308, wherein the interconnect structures 309 of the at least one die 308 are exposed (FIG. 3d). The molding material 311, 311' may comprise a second mold material 311, 311'. The molding material 311, 311' may comprise with any suitable molding material according to the particular application, and may surround the at least one die 308. In an embodiment, the molding material 311, 311' may comprise a thickness of between about 100 to about 400 microns, but may vary according to the particular application. In an embodiment, the molding material 311, 311' may be applied using a compression injection or a transfer molding technique, wherein the interconnect structures 309 of the at least one die 308 are exposed.

Figure 3E:
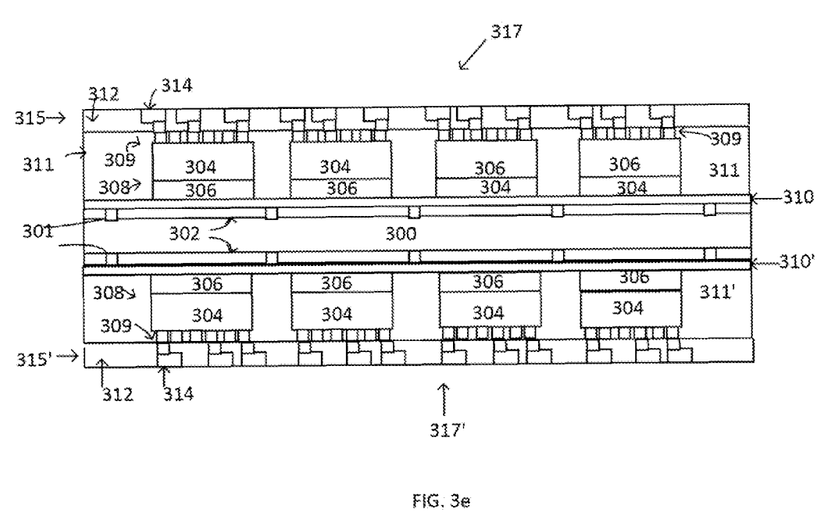
Figure 3F:
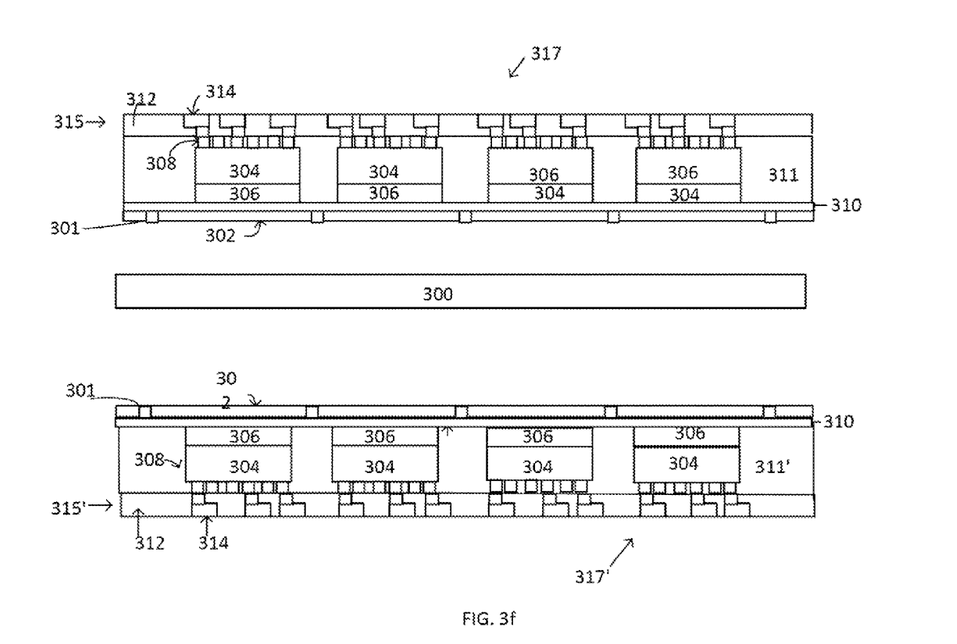

At least one build up layer 315, 315' may be formed on the second molding material 311, 311' and may the interconnect structures 309 of the at least one die 308 may be coupled with a conductive layer 314 of the at least one build up layer 315, 315' (FIG. 3e). The at least one build up layer 315, 315' may comprise a dielectric layer 312 and conductive layer 314. In an embodiment, a ball grid array land may be formed within the build up layer 315, 315', wherein the conductive layer 314 may serve as a ball grid array pad. In another embodiment, a package on package (PoP) land may be formed within the build up layer 315, 315', wherein a portion of the conductive layer may serve as a PoP pad.

Figure 3G:
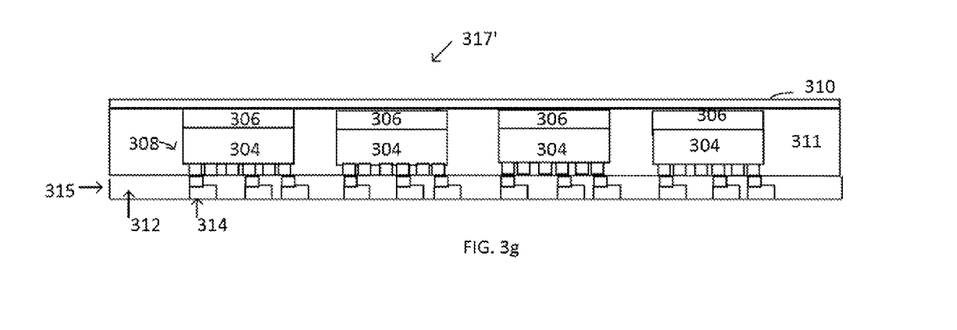
Figure 3H:
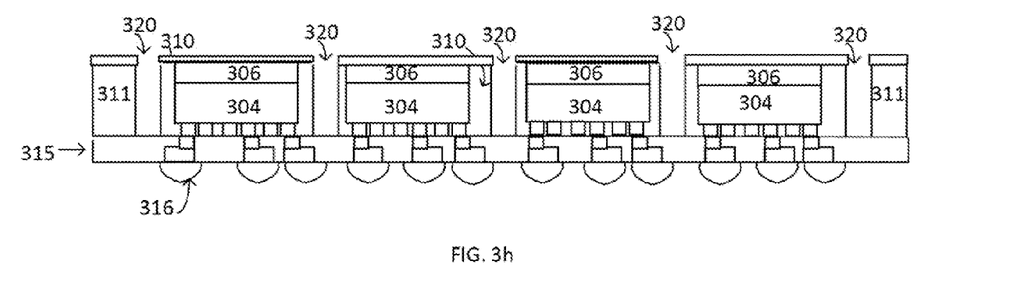

In an embodiment, a thin, coreless multi layered, dual sided panel 317, 317' may be formed, wherein the panels 317, 317' comprise minimal warpage due to the non-sacrificial 310, 310' molding material incorporated into the panel 317, 317'. In an embodiment, the dual sided panels 317, 317' may be separated at the base material 300 (FIG. 3*f*), and the thin foil 302, 302' may be removed from the base foil 300 (depicting only individual panel 317) (FIG. 3*g*). In an embodiment, the molding material 310, 310' may be patterned and etched to form openings 320 (FIG. 3*h*). The openings may comprise through mold vias 320. In an embodiment, a package on package (PoP) pad can be embedded in the buildup layer 315, 315' above the at least one die, wherein the openings 320 may expose the PoP pad, which may be adjacent the at least one die 308 in some cases.

Bumps 316, which may comprise solder interconnect bumps, 316, may be formed on/coupled with the build up layers 315, 315'. In an embodiment, the at least one die 308 may be singulated from the molded panels 317, 317' to create an embedded, molded die package.

The various embodiments of the package structures herein enable the fabrication of low cost, dual sided, embedded die, coreless substrates. Low warpage, HDI package structures are enabled. Panel level compression injection or transfer molding techniques may be utilized herein to produce molded panel core substrates. Non-sacrificial molding is used during the packaging structure fabrication, which provides rigidity, lowers warpage and lowers fabrication cost. Keep out zones are not required since the use of strip level molding is avoided. The embedded packages herein may be employed/coupled with in system on chip (SOC), central processing units (CPU), chipsets, radio devices, for example, to provide a low cost alternative to embedded die packaging.

In an embodiment, the package substrates of the embodiments herein (such as the package structures depicted in FIGS. 1*h*, 2*g*, 3*h*, for example), which may comprise molding compounds coupled with conductive layers that may be built up and separated by insulating materials (build up layers), wherein the molded panel structures may be coupled with various microelectronic devices. The devices may comprise such devices as a microelectronic memory die and a central processing unit (CPU) die in some cases, but may comprise any type of suitable device according to the particular application. In an embodiment, the package substrates herein may comprise a portion of an organic core package, and a careless, bumpless build up layer (BBUL) package structure, and may comprise PoP packages and through mold vies (TMV).

In an embodiment, the package structures of the embodiments herein may comprise any type of package substrate capable of providing electrical communications between a microelectronic device, such as a die and a next-level component to which the package structures may be coupled (e.g., a circuit board). In another embodiment, the package substrates herein may comprise any suitable type of package structures capable of providing electrical communication between a die and an upper integrated circuit (IC) package coupled with the device layer.

In some embodiments the package substrate/structure may further comprise a plurality of dies, which may be stacked upon one another, depending upon the particular embodiment. In some cases the die(s) may be located/attached/embedded on either the front side, back side or on/in some combination of the front and back sides of a package structure. In an embodiment, the die(s) may be partially or fully embedded in a package structure of the embodiments. The package structure may comprise a multi-chip 3D package structure that may include a central processing unit (CPU) in combination with other devices in an embodiment.

Figure 4:
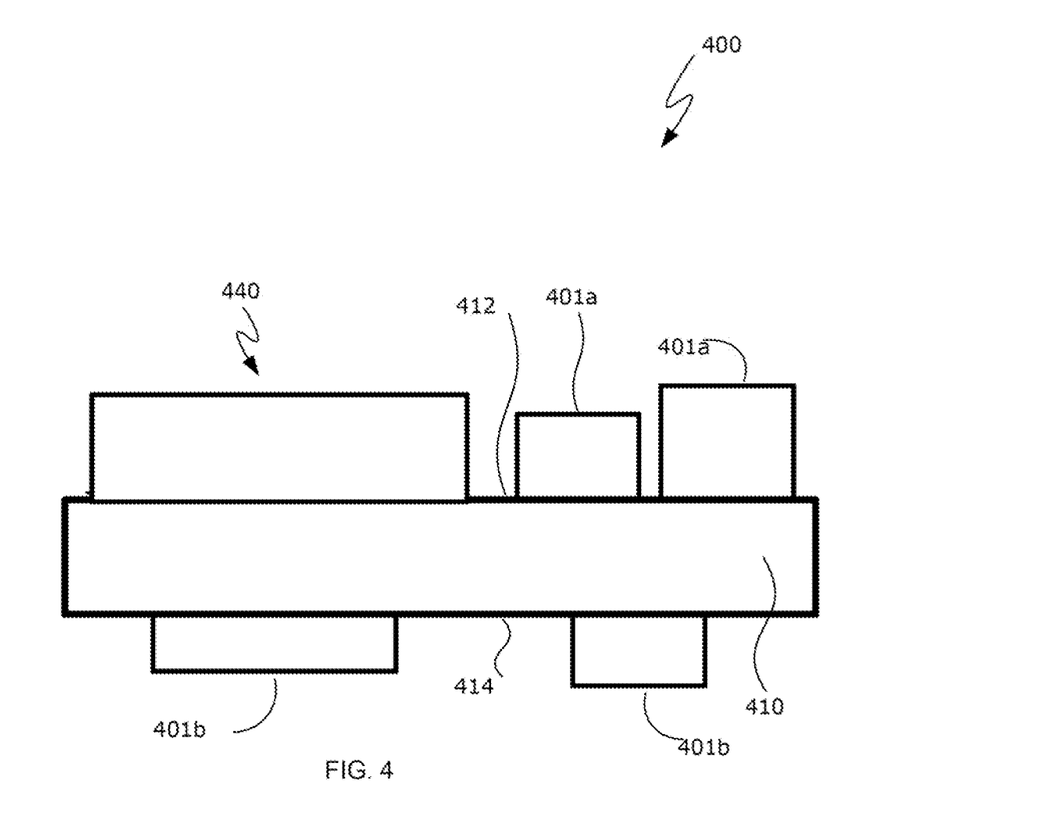
FIG. 4 represents across-sectional view of a system according to embodiments.

Turning now to FIG. 4, illustrated is an embodiment of a computing system 400. The system 400 includes a number of components disposed on a mainboard 410 or other circuit board. Mainboard 410 includes a first side 412 and an opposing second side 414, and various components may be disposed on either one or both of the first and second sides 412, 414. In the illustrated embodiment, the computing system 400 includes a package structure 440 disposed on the mainboard's first side 412, wherein the package structure 440 may comprise any of the package substrates with molded panel core structure embodiments described herein.

System 400 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 410 may comprise any suitable type of curt board or other substrate capable of providing electrical communication between one or more of the various components disposed on the board. In one embodiment, for example, the mainboard 410 comprises a printed circuit board (PCB) comprising multiple metal layers separated from one another by a layer of dielectric material and interconnected by electrically conductive vias. Any one or more of the metal layers may be formed in a desired circuit pattern to route —perhaps in conjunction with other metal layers—electrical signals between the components coupled with the board 410. However, it should be understood that the disclosed embodiments are not limited to the above-described PCB and, further, that mainboard 314 may comprise any other suitable substrate.

In addition to the package structure 440, one or more additional components may be disposed on either one or both sides 412, 414 of the mainboard 410. By way of example, as shown in the figures, components 401*a* may be disposed on the first side 412 of the mainboard 410, and components 401*b* may be disposed on the mainboard's opposing side 414. Additional components that may be disposed on the mainboard 410 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 400 includes a radiation shield. In a further embodiment, the computing system 400 includes a cooling solution. In yet another embodiment, the computing system 400 includes an antenna. In yet a further embodiment, the assembly 400 may be disposed within a housing or case. Where the mainboard 410 is disposed within a housing, some of the components of computer system 400—e.g., a user interface device such as a display or keypad, and/or a power supply, such as a battery— may be electrically coupled with the mainboard 410 (and/or a component disposed on this board) but may be mechanically coupled with the housing.

Figure 5:
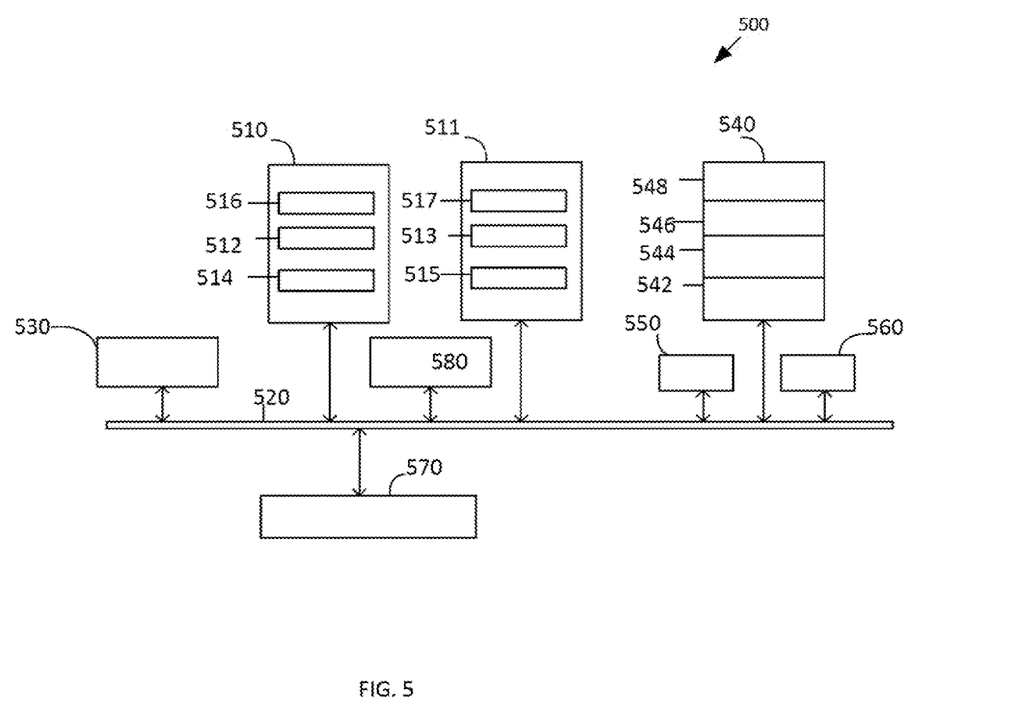
FIG. 5 represents a schematic of a system according to embodiments.

FIG. 5 is a schematic of a computer system 500 according to an embodiment. The computer system 500 (also referred to as the electronic system 500) as depicted can include a package structure/substrate that includes any of the several disclosed embodiments and their equivalents as set forth in this disclosure. The computer system 500 may be a mobile device such as a netbook computer. The computer system 500 may be a mobile device such as a wireless smart phone. The computer system 500 may be a desktop computer. The computer system 500 may be a hand-held reader. The computer system 500 may be integral to an automobile. The computer system 500 may be integral to a television.

In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically, communicatively coupled to the system bus 520 and includes any circuit, or combination of circuits according to an embodiment, including the package/device of the various embodiments included herein. In an embodiment, the integrated circuit 510 includes a processor 512 that can include any type of packaging structures according to the embodiments herein. As used herein, the processor 512 may mean any type of circuit such as, but not limited to, a microprocessor, a microcontroller, a graphics processor, a digital signal processor, or another processor. In an embodiment, the processor 512 includes any of the embodiments of the package structures disclosed herein. In an embodiment, SRAM embodiments are found in memory caches of the processor.

Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios and similar electronic systems. In an embodiment, the processor 512 includes on-die memory 516 such as static random-access memory (SRAM). In an embodiment, the processor 512 includes embedded on-die memory 516 such as embedded dynamic random-access memory (eDRAM).

In an embodiment, the integrated circuit 510 is complemented with a subsequent integrated circuit 511. In an embodiment, the dual integrated circuit 511 includes embedded on-die memory 517 such as eDRAM. The dual integrated circuit 511 includes an RFIC dual processor 513 and a dual communications circuit 515 and dual on-de memory 517 such as SRAM. The dual communications circuit 515 may be configured for RF processing.

At least one passive device 580 is coupled to the subsequent integrated circuit 511. In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548. In an embodiment, the electronic system 500 also includes a display device 550, and an audio output 560. In an embodiment, the electronic system 500 includes an input device such as a controller 570 that may be a keyboard mouse, touch pad, keypad, trackball, game controller, microphone, voice-recognition device, or any other input device that inputs information into the electronic system 500. In an embodiment, an input device 570 includes a camera. In an embodiment, an input device 570 includes a digital sound recorder. In an embodiment, an input device 570 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a packaging structure comprising:
    forming a first thin foil on a first side of a base foil and a second thin foil on a second side of the base foil;
    attaching at least one die directly on the first thin foil and attaching at least one die directly on the second thin foil;
    forming a molding material on the first thin foil and forming a molding material on the second thin foil, wherein the at least one die are embedded in the molding material; and
    forming at least one build up layer on the molding material disposed on the first thin foil and forming at least one build up layer on the molding material disposed on the second thin foils.

2. The method of claim 1 further comprising wherein the molding material comprises a non-sacrificial molding material.

3. The method of claim 2 further comprising wherein the molding material is applied to the first and second thin foil by using a compression technique.

4. The method of claim 1 further comprising forming conductive bumps on the at least one build up layer.

5. The method of claim 4 further comprising wherein the at least one die is embedded in the molding material.

6. The method of claim 1 further comprising wherein the package structure comprises a dual sided molded panel structure, wherein a first molded panel is disposed on the first side of the base foil, and a second molded panel is disposed on the second side of the base foil.

7. The method of claim 6 further comprising de-paneling the first molded panel from the first side of the base foil, and de-paneling the second molded panel from the second side of the base foil, wherein the first and second thin foils remain attached to the first and second molded cores respectively.

8. The method of claim 7 further comprising wherein the at least one die are singulated from the first and second molded panels.

9. The method of claim 8 further comprising wherein the singulated die comprise embedded die, molded package structures.

10. A method comprising:
    forming a first thin foil on a first side of a base foil and a second thin foil on a second side of the base foil;

forming a first molding material directly on the first thin foil and forming a first molding material directly on the second thin foil, wherein the first molding material is non-sacrificial; and coupling at least one die to the first molding material.

11. The method of claim 10 further comprising forming at least one build up layer directly on the first molding material disposed on the first side of the base foil to form a first molded panel, and forming at least one build up layer directly on the second side of the base foil and directly on the first molding material to form a second molded panel.

12. The method of claim 11 further comprising de-paneling the first molded panel and the second molded panel from the base foil.

13. The method of claim 12 further comprising coupling at least one die to the first molded panel and coupling at least one die to the second molded panel, wherein the at least one die is coupled through openings formed in the first molding material.

14. The method of claim 11 further comprising forming bumps on the at least one build up layer.

15. The method of claim 10 further comprising attaching at least one die on the first molding material disposed on the first side of the base foil and attaching at least one die on the first molding material disposed on the second side of the base foil.

16. The method of claim 15 further comprising forming a second mold material on the first molding material disposed on the first side of the base foil and forming a second molding material on the first molding material disposed on the second side of the base foil, wherein the at least one die disposed on the first and second side of the base foil are embedded in the second molding material.

17. The method of claim 16 further comprising forming at least one build up layer on the second molding material disposed on the first side of the base foil to form a first molded panel and forming at least one build up layer on the second mold material disposed on the second side of the base foil to form a second molded panel.

18. The method of claim 17 further comprising de-paneling the first and the second molded panel from the base foil.

19. The method of claim 18 further comprising forming bumps on a final layer of the at least one build up layer disposed on the first molded panel and forming bumps on a final layer of the at least one build up layer.

20. The method of claim 18 further comprising forming openings adjacent the at least one die through the first molding material and through the second molding material to form through mold vias.

21. The method of claim 2 further comprising wherein the molding material is applied to the first and second thin foil by using an injection technique.

22. The method of claim 2 further comprising wherein the molding material is applied to the first and second thin foil by using a transfer technique.

23. The method of claim 1, further including forming at least one fiducial in/on the first thin foil and forming at least one fiducial in/on the second thin foil.

24. The method of claim 23, wherein attaching the at least one die directly on the first thin foil includes aligning the at least one die with the at least one fiducial in/on the first thin foil, and wherein attaching the at least one die directly on the second thin foil includes aligning the at least one die with the at least one fiducial in/on the second thin foil.

25. The method of claim 10, further including forming at least one fiducial in/on the first thin foil and forming at least one fiducial in/on the second thin foil.

26. The method of claim 25, wherein coupling the at least one die to the first molding material includes aligning the at least one die with one of the at least one fiducial in/on the first thin foil and the at least one fiducial in/on second first thin foil.

27. The method of claim 10, wherein forming the first molding material comprises forming the first molding material having a thickness between about 100 and about 400 microns.

28. The method of claim 13 further comprising singulating the at least one die from at least one of the the first molded panel and the second molded panel.

* * * * *